United States Patent [19]

Greiff

[11] Patent Number: 5,129,983
[45] Date of Patent: Jul. 14, 1992

[54] METHOD OF FABRICATION OF LARGE AREA MICROMECHANICAL DEVICES

[75] Inventor: Paul Greiff, Wayland, Mass.

[73] Assignee: The Charles Stark Draper Laboratory, Inc., Cambridge, Mass.

[21] Appl. No.: 660,793

[22] Filed: Feb. 25, 1991

[51] Int. Cl.$^5$ .................. H01L 21/306; H01L 23/48; B44C 1/22; G01P 15/08
[52] U.S. Cl. .................. 156/628; 73/517 R; 156/643; 156/647; 156/651; 156/657; 156/659.1; 156/662; 357/69
[58] Field of Search ............... 156/628, 643, 647, 651, 156/657, 659.1, 662; 29/621.1, 25.35; 310/311, 312, 321, 361, 367; 357/26, 69; 73/488, 517 R, 517 A, 517 AV, 518, 700, 705, 702, 708, 720, 721, 726, 727; 338/2, 4; 437/182, 220

[56] References Cited

U.S. PATENT DOCUMENTS

| | | | |
|---|---|---|---|
| 3,053,095 | 9/1962 | Koril et al. | 73/504 |
| 3,251,231 | 5/1966 | Hunt et al. | 73/505 |
| 3,370,458 | 2/1968 | Dillon | 73/141 |
| 3,913,035 | 10/1975 | Havens | 331/107 R |
| 4,044,305 | 8/1977 | Oberbeck | 324/154 R |
| 4,149,375 | 4/1979 | Wynosky et al. | 60/262 |
| 4,209,993 | 7/1980 | Rannenberg | 62/80 |
| 4,234,666 | 11/1980 | Gursky | 428/573 |
| 4,321,500 | 3/1982 | Paros et al. | 310/321 |
| 4,342,227 | 8/1982 | Petersen et al. | 73/510 |
| 4,374,469 | 2/1983 | Rannenberg | 62/402 |
| 4,381,672 | 5/1983 | O'Connor et al. | 73/505 |
| 4,401,269 | 8/1983 | Eiler | 239/265.17 |
| 4,406,992 | 9/1983 | Kurtz et al. | 338/2 |
| 4,411,741 | 10/1983 | Janata | 204/1 T |
| 4,430,867 | 2/1984 | Warner | 62/402 |
| 4,447,753 | 5/1984 | Ochiai | 310/312 |
| 4,468,584 | 8/1984 | Nakamura et al. | 310/370 |
| 4,478,076 | 10/1984 | Bohrer | 73/204 |
| 4,478,077 | 10/1984 | Bohrer et al. | 73/204 |
| 4,483,194 | 11/1984 | Rudolf | 73/517 R |
| 4,484,382 | 11/1984 | Kawashima | 29/25.35 |
| 4,490,772 | 12/1984 | Blickstein | 361/281 |
| 4,495,499 | 1/1985 | Richardson | 343/5 DD |
| 4,499,778 | 2/1985 | Westhaver et al. | 74/5 F |
| 4,502,042 | 2/1985 | Wuhrl et al. | 340/568 |
| 4,522,072 | 6/1985 | Sulouff et al. | 73/765 |
| 4,524,619 | 6/1985 | Staudte | 73/505 |
| 4,538,461 | 9/1985 | Juptner et al. | 73/505 |
| 4,585,083 | 4/1986 | Nishiguchi | 177/229 |
| 4,592,242 | 6/1986 | Kempas | 74/5 F |
| 4,596,158 | 6/1986 | Strugach | 74/5 F |
| 4,598,585 | 7/1986 | Boxenhorn | 73/505 |
| 4,600,934 | 7/1986 | Aine et al. | 357/26 |
| 4,614,119 | 9/1986 | Zavracky et al. | 73/704 |

(List continued on next page.)

FOREIGN PATENT DOCUMENTS

| | | | |
|---|---|---|---|
| 55-121728 | 9/1980 | Japan | 310/367 |
| 58-136125 | 8/1983 | Japan | 310/367 |

(List continued on next page.)

OTHER PUBLICATIONS

"A Vibratory Micromechanical Gyroscope", Boxenhorn et al., AIAA Guidance, Navigation and Control Conference, Aug. 15-17, 1988, pp. 1033-1040.

(List continued on next page.)

Primary Examiner—William A. Powell
Attorney, Agent, or Firm—Weingarten, Schurgin, Gagnebiin & Hayes

[57] ABSTRACT

A method of fabrication of micromechanical devices enables the production of large area micromechanical transducer structures which are symmetric, stress balanced structures relatively devoid of geometric distortions. Micromechanical transducer structures are fabricated implementing processes and physical characteristics which overcome the unbalanced stresses occurring in high concentration diffusion planar structures that cause problematic geometric distortions that restrict physical size. Large increases in the practical size of micromechanical devices which may be fabricated are achieved while permitting greater depths of structural features, without the resultant concentration and stress distortions. Multilevel, balanced stress structures can be created which are of varying geometries at each level to produce a "sculpted" structure.

25 Claims, 3 Drawing Sheets

U.S. PATENT DOCUMENTS

| | | | |
|---|---|---|---|
| 4,619,001 | 10/1986 | Kane | 455/192 |
| 4,621,925 | 11/1986 | Masuda et al. | 356/350 |
| 4,628,283 | 12/1986 | Reynolds | 331/68 |
| 4,629,957 | 12/1986 | Walters et al. | 318/662 |
| 4,639,690 | 1/1987 | Lewis | 331/96 |
| 4,644,793 | 2/1987 | Church | 73/505 |
| 4,651,564 | 3/1987 | Johnson et al. | 73/204 |
| 4,653,326 | 3/1987 | Danel et al. | 73/517 R |
| 4,654,663 | 3/1987 | Alsenz et al. | 340/870.3 |
| 4,665,605 | 5/1987 | Kempas | 29/434 |
| 4,670,092 | 6/1987 | Motamedi | 156/643 |
| 4,671,112 | 6/1987 | Kimura et al. | 73/505 |
| 4,674,180 | 6/1987 | Zavracky et al. | 29/622 |
| 4,674,319 | 6/1987 | Muller et al. | 73/23 |
| 4,679,434 | 7/1987 | Stewart | 73/517 B |
| 4,680,606 | 7/1987 | Knutti et al. | 357/26 |
| 4,699,006 | 10/1987 | Boxenhorn | 73/517 |
| 4,705,659 | 11/1987 | Bernstein et al. | 264/29.6 |
| 4,706,374 | 11/1987 | Murakami | 437/225 |
| 4,712,439 | 12/1987 | North | 74/84 R |
| 4,736,629 | 4/1988 | Cole | 73/517 R |
| 4,743,789 | 5/1988 | Puskas | 310/316 |
| 4,744,248 | 5/1988 | Stewart | 73/505 |
| 4,744,249 | 5/1988 | Stewart | 73/505 |
| 4,747,312 | 5/1988 | Herzl | 73/861.38 |
| 4,750,364 | 6/1988 | Kawamura et al. | 73/510 |
| 4,764,244 | 8/1988 | Chitty et al. | 156/630 |
| 4,776,924 | 10/1988 | Delapierre | 156/647 |
| 4,783,237 | 11/1988 | Aine et al. | 437/15 |
| 4,789,803 | 12/1988 | Jacobsen et al. | 310/309 |
| 4,792,676 | 12/1988 | Hojo et al. | 250/231 |
| 4,805,456 | 2/1989 | Howe et al. | 73/517 |
| 4,808,948 | 2/1989 | Patel et al. | 331/4 |
| 4,835,961 | 6/1989 | Presz, Jr. et al. | 60/264 |
| 4,851,080 | 7/1989 | Howe et al. | 156/647 |
| 4,855,544 | 8/1989 | Glenn | 200/61.45 |
| 4,869,107 | 9/1989 | Murakami et al. | 73/517 R |
| 4,882,933 | 11/1989 | Petersen et al. | 73/517 R |
| 4,884,446 | 12/1989 | Ljung | 73/505 |
| 4,890,812 | 1/1990 | Chechile et al. | 248/674 |
| 4,893,509 | 1/1990 | MacIver et al. | 73/517 |
| 4,899,587 | 2/1990 | Staudte | 73/505 |
| 4,900,971 | 2/1990 | Kawashima | 310/361 |
| 4,901,586 | 2/1990 | Blake et al. | 73/862.59 |
| 4,916,520 | 4/1990 | Kurashima | 357/71 |
| 4,971,768 | 11/1990 | Ealba et al. | 422/176 |
| 4,981,552 | 1/1991 | Mikkor | 156/647 |
| 5,001,383 | 3/1991 | Kawashima | 310/367 |
| 5,016,072 | 5/1991 | Greiff | 357/26 |
| 5,045,152 | 9/1991 | Sickafus | 156/653 |

FOREIGN PATENT DOCUMENTS

| | | | |
|---|---|---|---|
| 59-37722 | 3/1984 | Japan | 310/367 |
| 59-158566 | 9/1984 | Japan . | |
| 61-144576 | 7/1986 | Japan . | |
| 62-71256 | 4/1987 | Japan . | |
| 62-221164 | 9/1987 | Japan . | |
| 63-169078 | 7/1988 | Japan . | |
| 2183040 | 5/1987 | United Kingdom . | |

OTHER PUBLICATIONS

"Monolithic Silicon Accelerameter", Boxenhorn et al., Transducers '89, Proceedings of the 5th Int'l Conference on Solid-State Sensors . . . , Jun. 25–30, 1989, pp. 273–277.

"An Electrostatically Rebalanced Micromechanical Accelerometer" Boxenhorn et al., AIAA Guidance, Navigation and Control Conference, Aug. 14–16, 1989, pp. 118–122.

"The Micromechanical Inertial Guidance System and Its Application", Boxenhorn et al., 14th Biennial Guidance Test Symposium, Oct. 3–5, 1989, pp. 113–131.

"Tensometric Accelerometers With Overload Protection", Moskalik, Meas. Tech., (USA), vol. 22, No. 12, (May 1980), pp. 1469–1471.

"Micromechanical Accelerometer Integrated with MOS Detection Circuitry", Petersen et al., IEEE Transactions on Electron Devices, vol. ED-29, No. (Jan. 1982), pp. 23–27.

"Quartz Rate Sensor Replaces Gyros", Defense Electronics, Nov. 1984, p. 177.

"A Monolithic Silicon Accelerometer with Integral Air Damping and Overrange Protection", Barth et al., IEEE 1988, pp. 35–38.

"Silicon as a Mechanical Material", Peterson et al., Proceedings of the IEEE, vol. 70, No. 5, May 1982, pp. 420–457.

"Machining in the Micro Domain", Rosen, Mechanical Engineering, Mar. 1989, pp. 40–46.

"Silicon Micromechanics: Sensors and Actuators on a Chip", Howe et al., IEEE Spectrum, Jul. 1990, pp. 29–35.

M. Nakamura et al., "Novel Electromechanical Micro-Machining and its Application for Semiconductor Acceleration Sensor IC", *Digest of Technical Papers* (1987), Institute of Electrical Engineers of Japan, pp. 112–115.

METHOD OF FABRICATION OF LARGE AREA MICROMECHANICAL DEVICES

FIELD OF THE INVENTION

The present invention relates to the fabrication of micromechanical devices, in particular to methods of fabricating planar micromechanical devices having large surface area.

BACKGROUND OF THE INVENTION

Planar micromechanical devices are known which are used for sensing acceleration, inertia and other physical parameters. Such devices are typically fabricated in silicon using semiconductor fabrication techniques. Micromechanical transducers are designed using planar structures such as cantilevered beams, tortionally suspended rectangular plates and planar geometries which must be freed up from the silicon mass from which they are derived. The process of freeing micromechanical transducers typically involves generating a highly doped pattern in the silicon which defines the desired structure. Generally, a high concentration boron diffusion on a surface of a silicon wafer is used to create an etch stop of appropriate depth and geometry. Anisotropic etching frees the desired structure comprising the high concentration boron doped silicon.

The boron diffusion process causes lateral stress in the silicon wafer proportional to the concentration of diffused boron. Since high concentrations are necessary for the anisotropic etch stop process, high stresses are induced. Moreover, since the diffusion results in a concentration gradient normal to the surface, there is a corresponding stress gradient causing a bimetallic-like strain effect which causes freed-up structures to curl and distort. Curling and geometric distortions give micromechanical transducers inconsistent and disadvantageous properties, make them more difficult to design and place practical limitations on the length, area and depth of structures which can be obtained.

Generally, the sensitivity of a micromechanical transducer is related to the area of the transducer element structure. Thus, limitations with respect to length, area and depths of structures imposed by unbalanced stresses leading to geometric distortions, is undesirable.

SUMMARY OF THE INVENTION

The present invention enables the production of large area micromechanical transducer structures which are symmetric, balanced stress structures relatively devoid of geometric distortions.

According to the invention, micromechanical transducer structures are fabricated implementing processes and physical characteristics which overcome the unbalanced stresses occurring in high concentration diffusion planar structures that cause problematic geometric distortions that restrict physical size. The large area devices of the present invention provide for distribution of dopant induced stress throughout the freed structure so that a balancing of stress and reduced distortion is achieved. In one embodiment a walled structure is formed as a doped tub, backfilled and sealed with a surface diffusion prior to etching the structure free. Alternatively, a structure is formed having a sequence of alternating diffusions and epitaxial layers. Additionally, grooves or corrugation are used to provide structures having stiffness in a direction transverse to the direction of a series of grooves forming the corrugation.

Features of the invention include a large increase in the practical size of micromechanical devices which may be fabricated. Greater thickness of structures than are practical with simple diffusion are possible according to the invention, without the resultant concentration and stress gradients. Further, multilevel balanced stress structures can be created which are of varying geometries at each level to produce a "sculpted" structure. With increased size, an improvement in overall sensitivity of the transducer is accomplished and many manufacturing tolerances are relieved.

DESCRIPTION OF THE DRAWING

These and other features and advantages of the present invention will become more apparent in light of the following detailed description of an illustrative embodiment thereof, as illustrated in the accompanying drawings, of which.

DETAILED DESCRIPTION OF THE INVENTION

Figure 1:
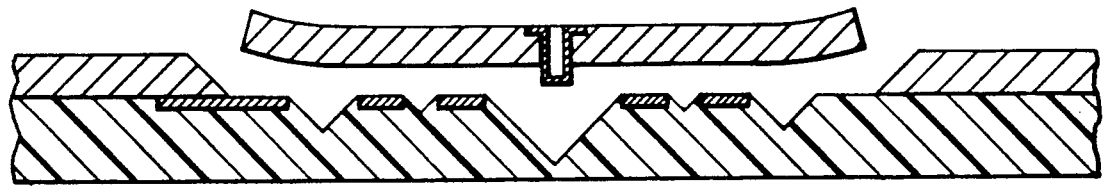
FIG. 1 is a side view of a prior art micromechanical structure having geometric distortion resulting from dopant concentration strain gradients.

Micromechanical structures, including plates, beams and the like, are typically created using a high concentration boron diffusion on a surface of a silicon wafer. The boron diffusion acts as an etch stop for anisotropic etching which yields the structures by etching away exposed undoped and lightly doped silicon material. Boron diffusion on a surface, to an appropriate depth, results in a concentration gradient that causes a stress gradient in the wafer which is proportional to the concentration. The stress gradient causes geometric distortions, such as curling, when the structure is freed up by etching. Such curling limits travel of the device and therefore limits the size of device that can be fabricated. A flexibly supported plate having undesirable geometric distortion according to the prior art, is illustrated in FIG. 1.

Figure 2A:
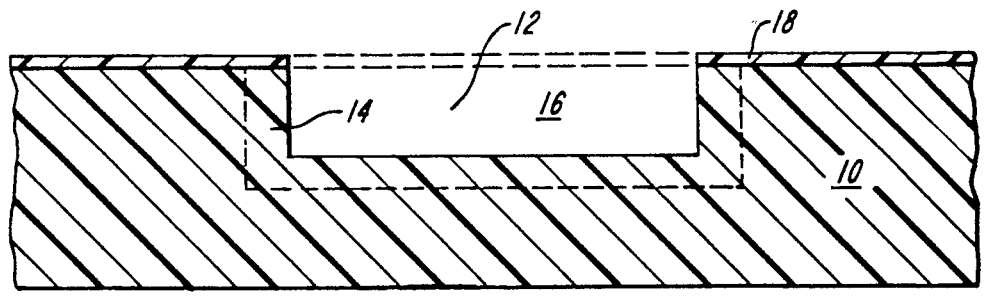
FIG. 2A is a side sectioned view of a tub in a first phase of fabricating a large area micromechanical device according to the invention.
Figure 2B:
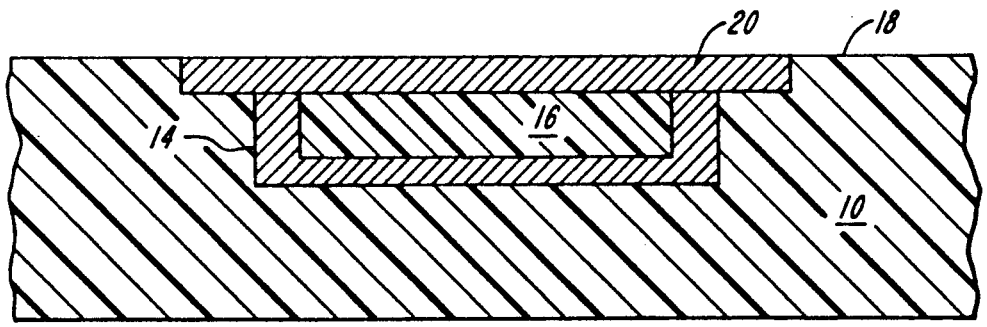
FIG. 2B is a side sectioned view of the tub of FIG. 2A back filled with silicon.

Referring to FIG. 2A, an illustrative embodiment of a micromechanical structure constructed according to the invention to minimize geometric distortion, is fabricated using a mass of silicon 10. In this embodiment of a micromechanical plate such as for an accelerometer, the N type silicon mass 10 has a large area tub 12 etched therein, outlining the structural feature, in this case a substantially symmetrical plate, to be created. An etch stop diffusion 14, such as with a boron dopant, is made onto all exposed surfaces of the tub 12, effectively establishing a doped bottom side 30 and doped side walls 32, 34. The tub 12 is then backfilled, preferably with single crystal silicon 16, although polysilicon may also be used to backfill the tub 12. A top surface 18 of the backfilled mass 10 is then back lapped to a mirror smoothness. The filled tub 12 is then sealed with a high concentration boron diffusion 20 on a top side of the filled surface, as illustrated in FIG. 2B. A four-sided doped envelope results which has a relatively lightly doped interior bulk.

Figure 2C:
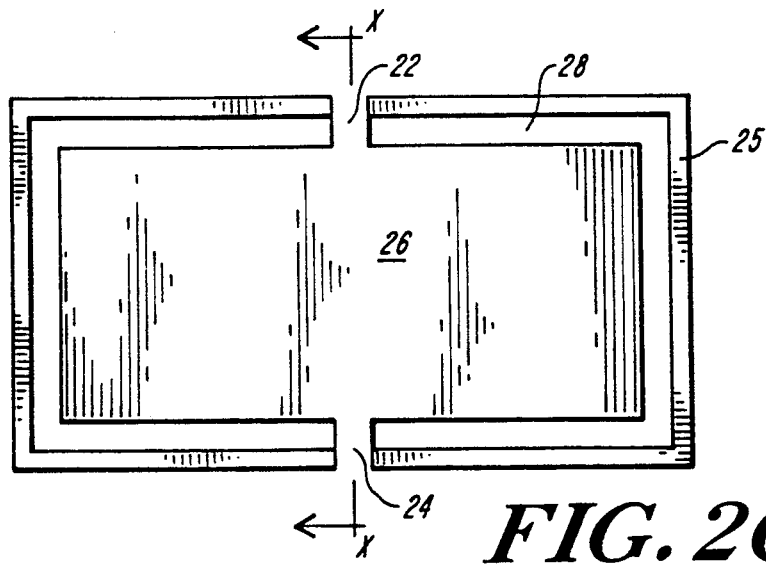
FIG. 2C is a plan view of an accelerometer plate formed from the tub of FIGS. 2A and 2B.
Figure 2D:
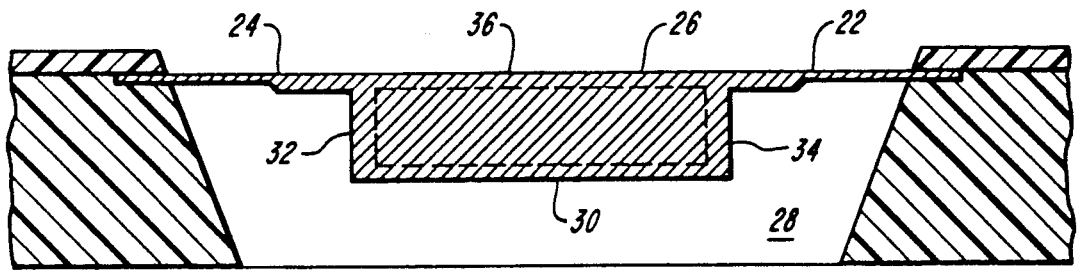
FIG. 2D is a cross-section of the plate/filled tub taken along a line x—x of FIG. 2C.

In this illustrative case of an accelerometric plate, relatively shallow diffusions are provided to define flexible linkages 22, 24 for attaching the plate 26 to a surrounding silicon frame 25, as illustrated in a plan view of a fully etched plate 26 in FIG. 2C. The plate 26 is etched substantially free of the mass 10, in this case by anisotropic etching. A void 28 is created by the etching which leaves the plate 26 free to rotate about an axis formed by the flexible linkages 22, 24. As illustrated in FIG. 2D, high concentration etch stop diffusions are present on all sides of the freed plate 26, including the bottom side 30 and the side walls 32, 34 created when the unfilled tub 12 was diffused, and the top side 36 created when the filled tub was sealed. The resulting structure is a substantially symmetric balanced stress structure, relatively free of the geometric distortions present in the prior art.

Figure 3A:
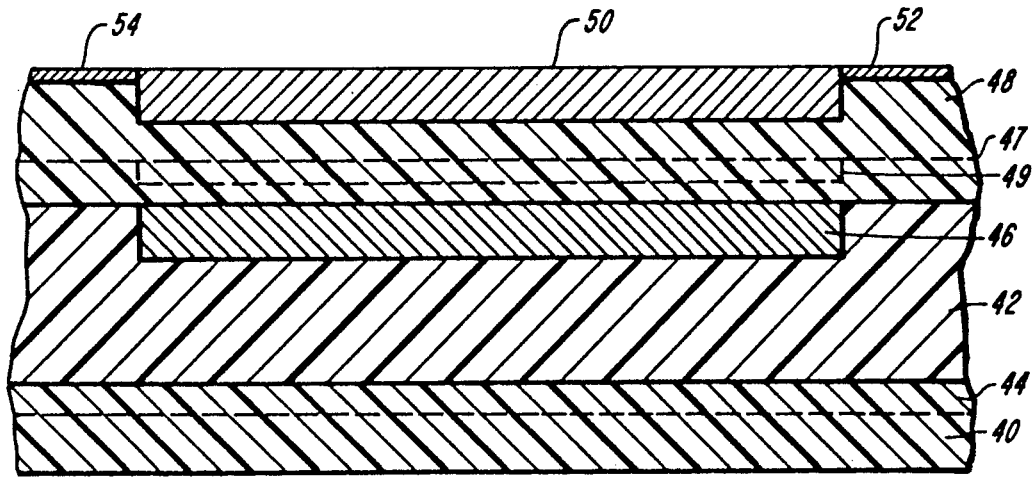
FIG. 3A is a side sectioned view of a micromechanical structure fabricated using sequentially grown epitaxial layers.

Alternatively, a low net strain structure, such as the accelerometric plate of FIG. 2C, can be fabricated as a sequence of layers as illustrated in FIG. 3A. A mass of N type silicon may provide a base or substrate 40 upon which a series of epitaxial layers is grown. To fabricate a plate according to this alternative embodiment, a first or lower epitaxial layer 42 is grown over the substrate 40, which optionally may have integral electrodes effected therein as a highly doped region 44. The lower epitaxial layer 42 is grown to a height which will provide adequate clearance for a freed plate of the desired plate thickness. The desired plate thickness in this illustrative embodiment is approximately 8 microns. The thickness of the first epi layer 42 is about 15 microns. A first patterned diffusion 46, comprising a p+ boron diffusion at etch stop concentration, is driven into the first epi layer 42 to a depth of about 3 microns. The diffusion is typically performed through openings in a thermally grown oxide layer which has been patterned in the shape of the desired structure by photolithography, in this case a substantially rectangular plate. A second or upper epitaxial layer 48 is grown to a thickness of about 5 microns. A second or upper patterned p+ diffusion 50 is driven into the second epi layer 48, at etch stop concentration, to a depth of about 3 microns.

Figure 3B:
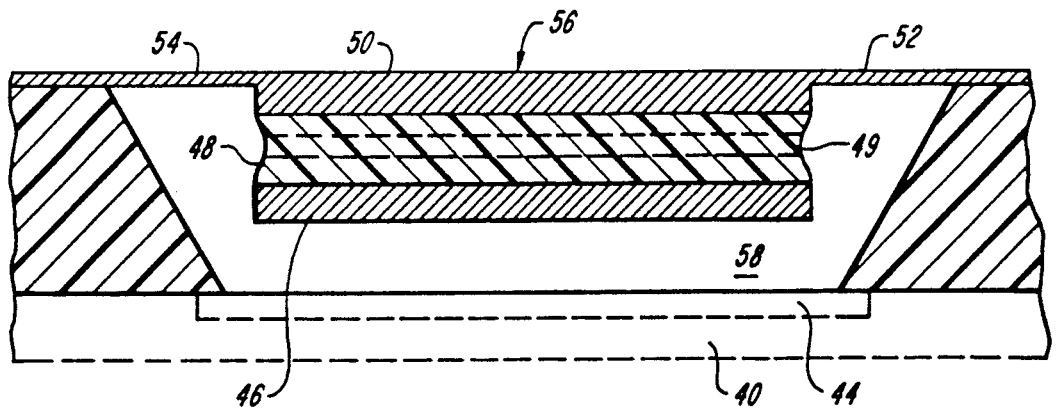
FIG. 3B is a side sectioned view of the micromechanical structure of FIG. 3A etched free.

In the illustrative acclerometric plate, substantially shallower p+ diffusions 52, 54 are patterned on the upper epi layer 48 to provide flexible linkages between the plate and the remaining silicon mass subsequent to etching. Anisotropic etching yields a plate structure 56 having a cross-section such as illustrated in FIG. 3B. The etching produces a void 58 which leaves the plate substantially free to rotate about an axis formed by the diffused flexible linkages 52, 54. The plate 56 comprises the first diffusion 46 and the second diffusion 50 with epitaxially-grown silicon layer 48 sandwiched therebetween.

The resultant doping distribution is symmetrical about the center of the plate 56. The net strain on the structure is therefore balanced such that the freed up plate 56 is substantially flat with respect to the substrate 40. Because of a redistribution of the diffusion within the silicon epitaxy, the sandwiched epitaxial layer 48 enjoys substantial etch resistance.

While the structure illustrated comprises only two epitaxial layers and two diffusions resulting in the sandwiched epitaxial layer 50, a sequence of epitaxial layers and diffusions can be fabricated to a desired depth providing considerable flexibility in the verticle dimensions of a structure fabricated according to the invention. It should be appreciated that numerous layers can be sequentially applied to construct the desired low net strain structure. FIGS. 3A and 3B illustrate that intermediate layers, such as intermediate epi layer 47 with intermediate etch resistant doped pattern 49 can be layered to a desired structures thickness.

Figure 4:
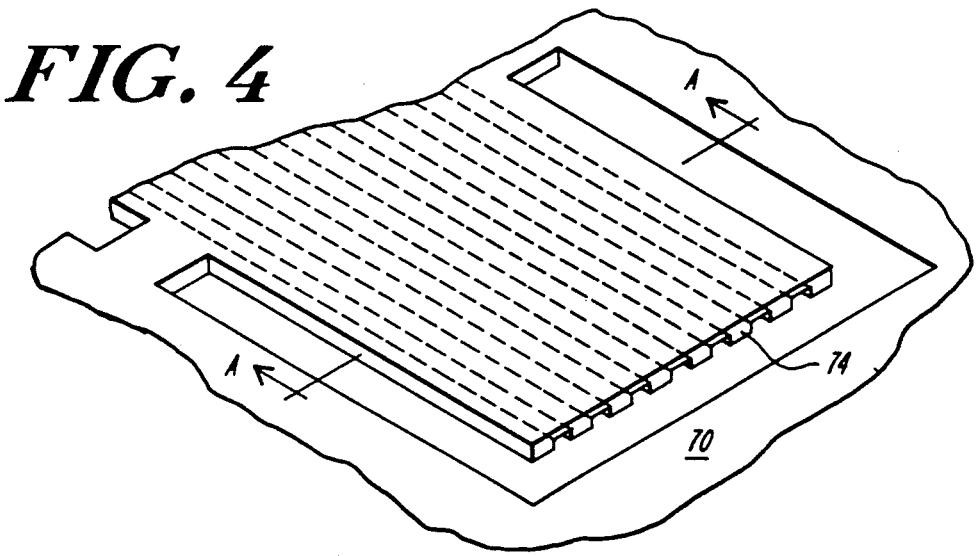
FIG. 4 is a partial perspective view of a planar micromechanical structure having corrugations.
Figure 4A:
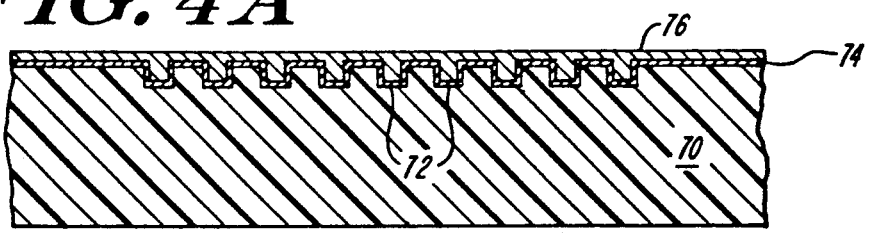
FIG. 4A is a side sectioned view of layers required to fabricate the illustrative planar micromechanical structure having corrugations.
Figure 4B:
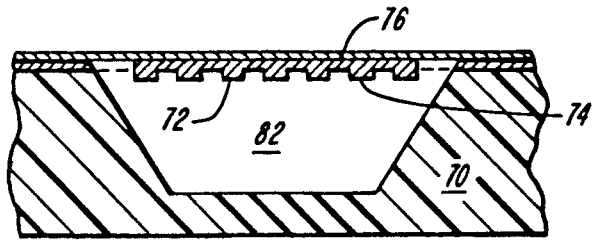
FIG. 4B is a side sectioned view of the micromechanical structure having corrugations of FIG. 4 taken along line A-A.

Referring now to FIGS. 4, 4A and 4B, geometric distortion in a planar micromechanical structure can be substantially eliminated by providing such a structure with a series of grooves or corrugations. Grooves provide rigidity in a direction transverse to the length of the groove. Various processes known in the semiconductor processing art can be used to create grooves in silicon.

A planar structure such as discussed hereinbefore is typically in tension along various axes coaxial with an axis formed by flexible linkages or flexures, as a result of shrinkage of doped material comprising the plate and flexures. A result of the same shrinkage is that the planar structure curls at the ends which are not held in tension by the flexures, such as is illustrated in FIG. 1. A series of grooves disposed in orthogonal relation with the axis formed by the flexures, provides rigidity which is effective in substantially eliminating the curling.

Such a structure as illustrated in FIGS. 4, 4A and 4B is fabricated from a mass of silicon 70, in this illustrative embodiment an N type silicon substrate. The substrate 70 is etched with a series of troughs 72 by an etch process as known in the art. In this case a plasma etch process is used to create troughs 72 having a u-shaped cross-section. Other etch processes can be used, such as anisotropic etching which creates a substantially v-shaped cross-sectioned trough. The etched surface having troughs 72 is diffused with a dopant, in this case boron, at etch stop concentration to create an etch resistant corrugated surface 74. The troughs or corrugations are subsequently filled with mono or polysilicon to produce a desired planar surface 76. It is conceivable that filling the troughs could be dispensed with, depending on the ultimate structure desired.

The planar surface 76 is diffused in a pattern to render the desired shape of the ultimate micromechanical structure, in this case a substantially rectangular planar member 80 attached to the silicon mass by flexible linkages. Anisotropic etching frees the planar member 80 and creates a void 82 beneath the planar member 80. The planar member 80 having the corrugated surface 74 as a bottom side thereof remains subsequent to etching, free to rotate in the void 82 about an axis created by the flexible linkages. The planar structure has relatively balanced stresses and is substantially distortion free along various axes orthogonal to the axis created by the flexible linkages axis.

Although boron diffusion and anisotropic etching are discussed herein to fabricate micromechanical structures having balanced stresses, one of ordinary skill in the art will appreciate that other dopants can be used to effect etch stopping and other etch processes can be used to create different effects. Other etch stop mechanisms such as electrochemical may also be employed.

While the invention is discussed in the context of a plate for a micromechanical accelerometer, other micromechanical structures, including planar structures such as cantilever beams and non-planar structures, can be fabricated according to the invention.

Although the invention has been shown and described with respect to an illustrative embodiment thereof, it should be understood by those skilled in the art that the foregoing and various other changes, omissions and additions in the form and detail thereof may be made without departing from the spirit and scope of the invention as delineated in the claims.

What is claimed is:

1. A method of creating a balanced stress micromechanical structure having at least first, second and third sides, wherein said structure is defined by diffusing a mass of silicon with a dopant, said method comprising the steps of:
   etching a tub in said mass of silicon, said tub defining at least one of said at least first, second and third sides of said structure;
   doping said tub by applying an etch stop diffusion comprising said dopant to all exposed surfaces of said tub;
   filling said tub with a silicon backfill to create a filled surface defining at least another of said first, second and third sides;
   diffusing said filled surface with said dopant to create an envelope having a sealed relatively lightly doped interior bulk, said envelope comprising said at least first, second and third sides; and
   etching said balanced stress micromechanical structure free from said mass of silicon.

2. The method of claim 1 wherein said mass of silicon is an N type silicon mass and said dopant is boron.

3. The method of claim 1 further including the step of:
   lapping said filled surface to create a mirror smooth filled surface prior to diffusing said filled surface.

4. The method of claim 1 wherein said silicon backfill is single crystal silicon.

5. The method of claim 1 wherein said silicon backfill is polysilicon.

6. A balanced stress micromechanical structure having a selected shape and at least a first and a second selected dimension, comprising:
   a mass of silicon;
   means for selectively providing etch resistance to said mass of silicon to generate etch resistant silicon integral with said mass of silicon, said means for selectively providing etch resistance being disposed in at least one pattern to provide at least some patterned etch resistant silicon;
   wherein said mass of silicon is exposed to etching means for selectively etching said mass of silicon while retaining said at least some patterned etch resistant silicon; and
   means for preventing geometric distortion or said at least some patterned etch resistant silicon upon freeing said at least some patterned etch resistant silicon from said silicon mass.

7. The balanced stress micromechanical structure of claim 6 wherein said means for preventing geometric distortion of said at least some patterned etch resistant silicon comprises:
   a first silicon surface;
   a first etch resistant surface disposed on said first silicon surface substantially in conformance with said at least one pattern to provide some of said at least some patterned etch resistant silicon as a lower surface;
   a first intermediate silicon fill disposed on said first etch resistant surface; and
   a second etch resistant surface disposed on said first intermediate silicon fill substantially in conformance with said at least one pattern to provide some of said at least some patterned etch resistant silicon as an upper surface
   wherein said at least some patterned etch resistant silicon defines said selected shape and wherein said first etch resistant surface, said intermediate silicon fill and said second etch resistant surface define at least one of said first and said second selected dimension of said balanced stess micromechanical structure.

8. The balanced stress micromechanical structure of claim 7 wherein said means for preventing geometric distortion of said at least some patterned etch resistant silicon further comprises:
   at least a second intermediate silicon fill disposed on an etch resistant surface; and
   at least a third etch resistant surface substantially in conformance with said at least one pattern to provide some of said at least some patterned etch resistant silicon.

9. The balanced stress micromechanical structure of claim 7 wherein said first silicon surface comprises a plurality of grooves.

10. The balanced stress micromechanical structure of claim 9 wherein said plurality of grooves have a substantially u-shaped cross-section formed by plasma etching.

11. The balanced stress micromechanical structure of claim 9 wherein said plurality of grooves have a substantially v-shaped cross-section formed by anisotropic etching.

12. The balanced stress micromechanical structure of claim 7 wherein said first intermediate silicon fill comprises epitaxially grown single crystal silicon.

13. The low net strain micromechanical structure of claim 7 wherein said first intermediate silicon fill comprises polysilicon.

14. A method of creating a planar balanced stress micromechanical structure in a mass of silicon, said method comprising the steps of:
   etching a plurality of grooves in said mass of silicon;
   doping said plurality of grooves by applying an etch stop diffusion to all exposed surfaces of said grooves to create an etch resistant corrugated lower surface;
   filling said plurality of grooves with a silicon to create a filled surface of said planar balanced stress micromechanical structure;
   diffusing said filled surface with an etch stop diffusion to create an etch resistant upper planar surface; and
   etching said planar balanced stress micromechanical structure substantially free from said silicon mass.

15. The method of claim 14 wherein said step of etching said plurality of grooves in said mass of silicon includes performing anisotropic etching whereby said grooves have a substantially v-shaped cross-section.

16. The method of claim 14 wherein said step of etching said plurality of grooves in said mass of silicon includes performing plasma etching whereby said grooves have a substantially u-shaped cross section.

17. The method of claim 14 wherein applying said etch stop diffusion includes doping said plurality of grooves with boron dopant.

18. The method of claim 14 wherein said silicon used to create said filled surface is epitaxially grown single crystal silicon.

19. The method of claim 14 wherein said silicon used to create said filled surface is polysilicon.

20. The method of claim 14 wherein said step of etching said low net strain micromechanical structure substantially free from said silicon mass includes anisotropic etching.

21. A method of fabricating a balanced stress micromechanical structure in a mass of silicon, said method comprising the steps of:

applying a etch stop dopant in a pattern on a first surface of said mass of silicon;

growing an intermediate layer of silicon over said etch stop dopant patterned on said first surface of said mass of silicon;

applying a second etch stop dopant in a second pattern on said intermediated layer of silicon; and etching said balanced stress micromechanical structure substantially free from said mass of silicon.

22. The method of claim 21 wherein said etch stop dopant is boron.

23. The method of claim 21 wherein said intermediate layer of silicon is epitaxially grown single crystal silicon.

24. The method of claim 21 wherein said intermediate layer of silicon is polysilicon.

25. The method of claim 21 wherein said step of etching said balanced stress micromechanical structure substantially free from said mass of silicon includes anisotropically etching said mass of silicon to undercut said etch stop dopant in said pattern on said first surface.

* * * * *